US011074878B2

(12) United States Patent
Zhang

(10) Patent No.: US 11,074,878 B2
(45) Date of Patent: Jul. 27, 2021

(54) LIQUID CRYSTAL DISPLAY

(71) Applicant: Shenzhen China Star Optoelectronics Semiconductor Display Technology Co., Ltd., Shenzhen (CN)

(72) Inventor: Xianming Zhang, Shenzhen (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 284 days.

(21) Appl. No.: 16/308,475

(22) PCT Filed: Sep. 27, 2018

(86) PCT No.: PCT/CN2018/107813
§ 371 (c)(1),
(2) Date: Dec. 9, 2018

(87) PCT Pub. No.: WO2020/015178
PCT Pub. Date: Jan. 23, 2020

(65) Prior Publication Data

US 2021/0125572 A1 Apr. 29, 2021

(30) Foreign Application Priority Data

Jul. 20, 2018 (CN) ......................... 201810805790.9

(51) Int. Cl.
*G09G 3/36* (2006.01)
*G09G 3/20* (2006.01)
*H03K 17/22* (2006.01)

(52) U.S. Cl.
CPC ... *G09G 3/3611* (2013.01); *G09G 2310/0243* (2013.01); *G09G 2310/08* (2013.01); *G09G 2330/026* (2013.01); *G09G 2330/027* (2013.01)

(58) Field of Classification Search
CPC ......... G09G 3/3611; G09G 2310/0243; G09G 2310/08; G09G 2330/026–027
See application file for complete search history.

(56) References Cited

U.S. PATENT DOCUMENTS

2017/0148407 A1* 5/2017 Lee ...................... G09G 3/2096
2019/0253048 A1* 8/2019 Kim ...................... H03K 17/22

FOREIGN PATENT DOCUMENTS

CN 1280780 C * 10/2006 ........... G09G 3/3611
CN 106297711 A * 1/2017 ............... G09G 3/36
CN 106873688 A * 6/2017 ............ G05F 1/461

* cited by examiner

*Primary Examiner* — Lin Li
(74) *Attorney, Agent, or Firm* — Leong C. Lei

(57) ABSTRACT

Disclosed is a liquid crystal display, including: a timing controller, including a reset pin, a reset auxiliary pin, a charging circuit and a charging control circuit; a reset pin circuit; a reset auxiliary pin circuit, of which a reset auxiliary pin is externally connected to a first end of a second resistor and a first end of a second capacitor, and a second end of the second resistor and a second end of the second capacitor are grounded; wherein the charging circuit includes a current source and a current source switch, and the current source is connected to an input end of the current source switch, and an output end of the current source switch is connected to the first end of the second capacitor, and a control end of the current source switch is connected to a charging control signal.

9 Claims, 2 Drawing Sheets

LIQUID CRYSTAL DISPLAY

FIELD OF THE INVENTION

The present invention relates to a display technology field, and more particularly to a liquid crystal display.

BACKGROUND OF THE INVENTION

The liquid crystal display possesses many advantages of being ultra thin, power saved and radiation free. It has been widely utilized in, such as LCDTV, smart phones, digital cameras, tablets, laptop screens or notebook screens, and dominates the flat panel display field.

Most of the liquid crystal displays on the present market are backlight type liquid crystal display devices, which comprise a liquid crystal display panel and a backlight module. Generally, the liquid crystal display panel is composed of a color film substrate, an array substrate, a liquid crystal sandwiched between the color film substrate and the array substrate and a border adhesive. The liquid crystal display is changes the polarization state of light by controlling the liquid crystal molecular orientation with the electric field, and the purpose of display is achieved by penetration and blocking of the light path with the polarizers.

The timing controller (TCON) is a key component in the liquid crystal display driver circuit. It is generally used to convert the low voltage differential signal (LVDS) sent by the main board into the gate driving signal and the source driving signal required for the liquid crystal panel display to complete the conversion output of the low-voltage differential signal to the mini low-voltage differential signal (MINI-LVDS), and to output various control timings required for gate driver and source driver. The timing controller is typically provided with a reset circuit to ensure proper operation after powering up.

In the use of the liquid crystal display, the situation of quick turning on and off is often encountered, but when the device is turned on and off quickly, there is a chance that a reset abnormality occurs. The main reason is that the shutdown power-on interval is too short, and the internal logic circuit of the timing controller cannot work normally.

FIG. 1 is a diagram of a basic circuit of a reset timing controller. After the power is turned on, the power supply voltage VDD starts to charge the first capacitor C1 through the first resistor R1, and the reset pin voltage Vrst is initially low, and then the timing controller starts to reset. After the first capacitor C1 is charged, the reset pin voltage Vrst is high, and the potential is reset by the timing controller. According to the basic circuit of the reset of the existing timing controller, when the power is turned on and off quickly, the charge on the first capacitor C1 cannot be completely released, but the power supply voltage/core voltage (VDD/Vcore) may have been completely discharged, which may cause the abnormality when the device is rebooted, again.

SUMMARY OF THE INVENTION

An objective of the present invention is to provide a liquid crystal display that prevents reset abnormality when turning on and off quickly.

For realizing the aforesaid objectives, the present invention provides a liquid crystal display, comprising:

a timing controller, including a reset pin, a reset auxiliary pin, a charging circuit and a charging control circuit;

a reset pin circuit, including a first resistor and a first capacitor, wherein a first end of the first resistor and a first end of the first capacitor are respectively connected to the reset pin, and a second end of the first resistor is connected to a power supply voltage, first, and a second end of the first capacitor is grounded;

a reset auxiliary pin circuit, including a second resistor and a second capacitor, wherein a first end of the second resistor and a first end of the second capacitor are respectively connected to the reset auxiliary pin, and a second end of the second resistor and a second end of the second capacitor are grounded;

wherein the charging circuit comprises a current source and a current source switch, and the current source is connected to an input end of the current source switch, and an output end of the current source switch is connected to the first end of the second capacitor, and a control end of the current source switch is connected to a charging control signal for controlling whether the charging circuit charges the second capacitor;

wherein the charging control circuit is configured to generate the charging control signal, and when a condition that a voltage of the reset auxiliary pin is less than a preset first reference voltage and a voltage of the reset pin is greater than a preset second reference voltage, the charging control signal controls the charging circuit to charge the second capacitor.

The charging control circuit comprises:

a logic processing circuit, configured to determine whether the voltage of the reset auxiliary pin is less than the preset first reference voltage and the voltage of the reset pin is greater than the preset second reference voltage; and a charging control signal generating circuit, generating the charging control signal according to a determination of the logic processing circuit.

The logic processing circuit comprises:

a first comparator, configured to compare the voltage of the reset auxiliary pin with the first reference voltage, and to output a first result to a logic circuit;

a second comparator, configured to compare the voltage of the reset pin with the second reference voltage, and to output a second result to the logic circuit; and the logic circuit, determining whether a condition is satisfied according to the first result and the second result and outputting a third result to the charging control signal generating circuit.

The logic processing circuit is an AND circuit.

An inverting input end of the first comparator is inputted with the voltage of the reset auxiliary pin, and a non-inverting input end of the first comparator is inputted with the first reference voltage.

A non-inverting input end of the second comparator is inputted with the voltage of the reset pin, and an inverting input end of the second comparator is inputted with the second reference voltage.

The charging control signal generating circuit comprises:

a silicon controlled rectifier, of which a control end is inputted with a result of the logic processing circuit, an anode is connected to a control end of a switch transistor, and a cathode is grounded; and the switch transistor, of which the control end is connected to the power supply voltage through a third resistor, and a first end is grounded, and a second end is connected to the power supply voltage through a fourth resistor, and the second end is further connected to the charging control signal.

The silicon controlled rectifier comprises an NPN triode and a PNP triode.

The current source switch is a metal oxide semiconductor field effect transistor.

In conclusion, in the liquid crystal display of the present invention, with collective effect of the reset pin and the reset auxiliary pin, whether the reset starts or ends is determined to prevent the reset abnormality when turning on and off quickly; it cannot only delay the reset of VDD supply for a certain period of time when normally turning on and off, but also can delay the reset of VDD supply for a certain time when quickly turning on and off.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

Figure 1:
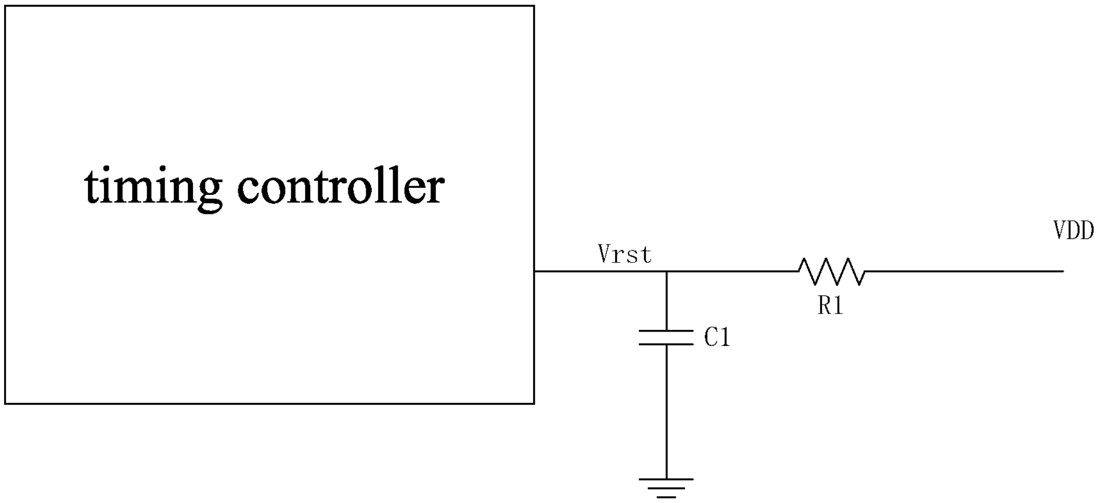
Fig. 1 Prior Art
FIG. 1 is a diagram of a basic circuit of a reset timing controller.
Figure 2:
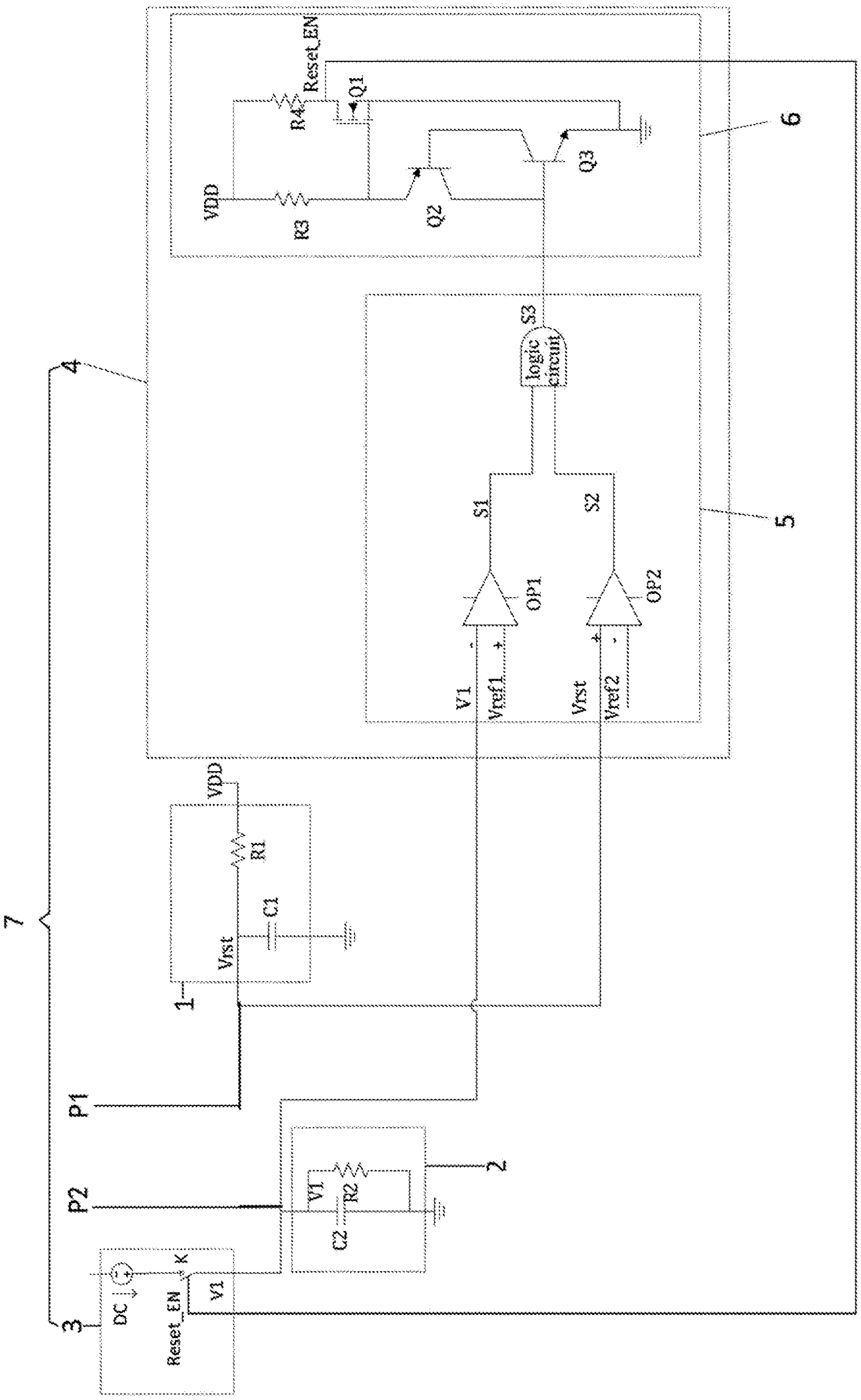
FIG. 2 is a circuit diagram of one preferred embodiment of a liquid crystal display of the present invention.

Please refer to FIG. 2, which is a circuit diagram of one preferred embodiment of a liquid crystal display of the present invention. The liquid crystal display mainly comprises: a reset pin circuit 1, a reset auxiliary pin circuit 2 and a timing controller 7; the timing controller 7 includes a reset pin, a reset auxiliary pin, a charging circuit 3 and a charging control circuit 4 configured to control a voltage of the reset auxiliary pin; the charging control circuit 4 comprises a logic processing circuit 5 and a charging control signal generating circuit 6; when the timing controller power-on condition is satisfied, the charging control circuit 4 generates a charging control signal Reset_EN to control the charging circuit 3 to start charging. In the present invention, a pin is added as a reset auxiliary pin in the timing controller, and cooperates with the reset pin to determine whether the reset starts or ends to prevent the abnormality when the device is turned on and off (power-on) quickly.

The reset pin circuit 1 can refer to the prior art. In this embodiment, the first resistor R1 and the first capacitor C1 are included. The reset pin of the timing controller 7 is connected to a first end of the first resistor R1 and a first end of the first capacitor C1, respectively. A second end of the first resistor R1 is connected to a power supply voltage VDD, and a second end of the first capacitor C1 is grounded.

The reset auxiliary pin circuit 2 includes a second resistor R2 and a second capacitor C2. The reset auxiliary pin added in the timing controller 7 is connected to a first end of the second resistor R2 and a first end of the second capacitor C2, respectively, and a second end of the second resistor R2 and a second end of the second capacitor C2 are grounded.

The charging circuit 3 comprises a current source and a current source switch K, and the current source is connected to an input end of the current source switch K, and an output end of the current source switch K is connected to the first end of the second capacitor C2, and a control end of the current source switch K is connected to a charging control signal Reset_EN for controlling whether the charging circuit 3 charges the second capacitor C2. The current source controls the voltage V1 of the reset auxiliary pin by charging the second capacitor C2, and whether charging to the second capacitor C2 is started is controlled by the charging control signal Reset_EN; the current source switch K can adopt a MOS transistor, and can connect the charging control signal Reset_EN to a control end of the MOS transistor, and to control the charging and discharging of the current source by using the charging control signal Reset_EN; for instance, when the Reset_EN is set to High level, the second capacitor C2 is started to be charged, and the charging current is much larger than the discharging current of the second resistor R2.

The charging control circuit 4 is configured to generate the charging control signal Reset_EN, and when a condition that a voltage V1 of the reset auxiliary pin is less than a preset first reference voltage Vref1 and a voltage Vrst of the reset pin is greater than a preset second reference voltage Vref2, the charging control signal Reset_EN controls the charging circuit 3 to charge the second capacitor C2. In the present invention, the timing controller 7 determines whether the power-on condition is satisfied by acquiring the voltage V1 of the reset auxiliary pin and the voltage Vrst of the reset pin; in this preferred embodiment, when the timing controller 7 turns on the device, the condition needs to be satisfied that the voltage V1 of the reset auxiliary pin is greater than the preset first reference voltage Vref1 and the voltage Vrst of the reset pin is greater than the preset second reference voltage Vref2.

In this preferred embodiment, the charging control circuit 4 may include a logic processing circuit 5 for determining whether the timing controller 7 satisfies the power-on condition, and a charging control signal generating circuit 6 that generates the charge control signal Reset_EN according to the third result S3 of the logic processing circuit 5. The logic processing circuit 5 mainly includes a first comparator OP1, a second comparator OP2 and a logic circuit. The charging control signal generating circuit 6 mainly includes a switch transistor Q1, a third resistor R3, a fourth resistor R4, a PNP triode Q2, and an NPN triode Q3.

The logic processing circuit 5 mainly comprises:

an inverting input end of the first comparator OP1 is inputted with the voltage V1 of the reset auxiliary pin, and a non-inverting input end of the first comparator is inputted with the first reference voltage Vref1, and the voltage V1 of the reset auxiliary pin is compared with the first reference voltage Vref1, and a first result S1 is outputted to the logic circuit;

a non-inverting input end of the second comparator OP2 is inputted with the voltage Vrst of the reset pin, and an inverting input end of the second comparator OP2 is inputted with the second reference voltage Vref2, and the voltage Vrst of the reset pin is compared with the second reference voltage Vref2, and a second result S2 is outputted to the logic circuit; and The logic circuit processes the first result Si and the second result S2 according to the preset logic, and outputs the third result S3 to the charging control signal generating circuit 6, and according to the preset logic, it is determined whether the condition that the timing controller 7 powers on the device is satisfied or not, i.e., the voltage V1 of the reset auxiliary pin is greater than the preset first reference voltage Vref1 and the voltage Vrst of the reset pin is greater than the preset second reference voltage Vref2. In this embodiment, the logic processing circuit can be an AND circuit.

The charging control signal generating circuit 6 mainly comprises:

in a silicon controlled rectifier composed of a PNP triode Q2 and an NPN triode Q3, the control end s inputted with the third result S3 of the logic processing circuit 5, and an anode is connected to the control end of the switch transistor Q1, and the cathode is grounded;

the control end of the switch transistor Q1 is connected to the power supply voltage VDD through the third resistor R3, the first end of the switch transistor is grounded, the second end of the switch transistor is connected to the power supply voltage VDD through the resistor fourth resistor R4, and the second end of the switch transistor is also connected to the charging control signal Reset_EN. The switch transistor Q1 may specifically be an NMOS. In the preferred embodiment, when the third result S3 is low level, the charging control signal Reset_EN is at a low level; when the third result S3 is changed to high level, that is, when the timing controller power-on condition is satisfied, the charging control signal Reset_EN can be kept at high level after powering on, so that the current source is controlled to be on.

In the present invention, the timing controller 7 needs to meet two conditions when the power is turned on, that is, the voltage V1 of the reset auxiliary pin is smaller than the first reference voltage Vref1, and the voltage Vrst of the reset pin is greater than the second reference voltage Vref2. With collective effect of the reset pin and the reset auxiliary pin, whether the reset starts or ends is determined. After the two conditions are satisfied, the reboot (power-on) is performed to prevent the rest abnormality; under such condition, the requirement is:

in condition of slow power-on, that is, after the power is turned off and then is turned on slowly, the charge of the second capacitor C2, that generates the voltage V1 of the reset auxiliary pin, has been discharged, and the first condition is satisfied; then, as long as the power supply voltage VDD is charged to the first capacitor C1 through the first resistor R1 for a certain period of time, the voltage Vrst of the reset pin is greater than the second reference voltage Vref2 and the second condition can be satisfied, and the charging time conforms to the formula $Vt=V0+(Vu-V0)\times[1-\exp(-t/RC)]$; this equation represents charging the capacitor C through the resistor R, wherein V0 is an initial voltage value on the capacitor C; Vu is a full charged voltage of the capacitor C; Vt is a voltage value on the capacitor C at an arbitrary time point t. A proper second reference voltage Vref2 is preset, and by this formula, the time that the power supply voltage VDD charges the first capacitor C1 to the reset condition can be calculated.

In condition of quick power-on, that is, after the power is turned off and then is turned on quickly, the power supply voltage VDD drops rapidly after the power is turned off. At this time, the latch inside the timing controller 1 has stopped working. The charging control signal Reset_EN is low level. If the power is turned on after reset, the two conditions needs to be satisfied, again. However, since the charge on the second capacitor C2 needs to be discharged, it will not be reset quickly. The discharge formula needs to be satisfied, and the pre-calculated discharge time has to be met, the rest is possible for entering the normal operation. The discharge time meets the formula $Vt=V0\times\exp(-t/RC)$, and the formula represents that the capacitor C with the initial voltage V0 is discharged through the resistor R, and Vt is the voltage value of the capacitor at arbitrary time t. By presetting a proper first reference voltage Vref1, the discharged time required for the second capacitor C2 can be predetermined.

Thereby, by setting a proper first reference voltage Vref1 and a proper second reference voltage Vref2 in advance, the present invention cannot only delay the reset of VDD supply for a certain period of time when normally turning on and off (power-on), but also can delay the reset of VDD supply for a certain time when quickly turning on and off to allow enough time for reset to avoid reset abnormality when turning on and off quickly.

In conclusion, in the liquid crystal display of the present invention, with collective effect of the reset pin and the reset auxiliary pin, whether the reset starts or ends is determined to prevent the reset abnormality when turning on and off quickly; it cannot only delay the reset of VDD supply for a certain period of time when normally turning on and off, but also can delay the reset of VDD supply for a certain time when quickly turning on and off.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A liquid crystal display, comprising:

a timing controller, including a reset pin, a reset auxiliary pin, a charging circuit and a charging control circuit;

a reset pin circuit, including a first resistor and a first capacitor, wherein a first end of the first resistor and a first end of the first capacitor are respectively connected to the reset pin, and a second end of the first resistor is connected to a power supply voltage, and a second end of the first capacitor is grounded;

a reset auxiliary pin circuit, including a second resistor and a second capacitor, wherein a first end of the second resistor and a first end of the second capacitor are respectively connected to the reset auxiliary pin, and a second end of the second resistor and a second end of the second capacitor are grounded;

wherein the charging circuit comprises a current source and a current source switch, and the current source is connected to an input end of the current source switch, and an output end of the current source switch is connected to the first end of the second capacitor, and a control end of the current source switch is connected to a charging control signal for controlling whether the charging circuit charges the second capacitor;

wherein the charging control circuit is configured to generate the charging control signal, and when a condition that a voltage of the reset auxiliary pin is less than a preset first reference voltage and a voltage of the reset pin is greater than a preset second reference voltage, the charging control signal controls the charging circuit to charge the second capacitor.

2. The liquid crystal display according to claim 1, wherein the charging control circuit comprises:

a logic processing circuit, configured to determine whether the voltage of the reset auxiliary pin is less than the preset first reference voltage and the voltage of the reset pin is greater than the preset second reference voltage; and a charging control signal generating circuit, generating the charging control signal according to a determination of the logic processing circuit.

3. The liquid crystal display according to claim 2, wherein the logic processing circuit comprises:

a first comparator, configured to compare the voltage of the reset auxiliary pin with the first reference voltage, and to output a first result to a logic circuit;

a second comparator, configured to compare the voltage of the reset pin with the second reference voltage, and to output a second result to the logic circuit;

the logic circuit, determining whether a condition is satisfied according to the first result and the second result and outputting a third result to the charging control signal generating circuit.

4. The liquid crystal display according to claim 3, wherein the logic processing circuit is an AND circuit.

5. The liquid crystal display according to claim 3, wherein an inverting input end of the first comparator is inputted with the voltage of the reset auxiliary pin, and a non-inverting input end of the first comparator is inputted with the first reference voltage.

6. The liquid crystal display according to claim 3, wherein a non-inverting input end of the second comparator is inputted with the voltage of the reset pin, and an inverting input end of the second comparator is inputted with the second reference voltage.

7. The liquid crystal display according to claim 2, wherein the charging control signal generating circuit comprises:

a silicon controlled rectifier, of which a control end is inputted with a result of the logic processing circuit, an anode is connected to a control end of a switch transistor, and a cathode is grounded; and the switch transistor, of which the control end is connected to the power supply voltage through a third resistor, and a first end is grounded, and a second end is connected to the power supply voltage through a fourth resistor, and the second end is further connected to the charging control signal.

8. The liquid crystal display according to claim 7, wherein the silicon controlled rectifier comprises an NPN triode and a PNP triode.

9. The liquid crystal display according to claim 1, wherein the current source switch is a metal oxide semiconductor field effect transistor.

* * * * *